(12) United States Patent
Muttam et al.

(10) Patent No.: US 9,913,387 B1
(45) Date of Patent: Mar. 6, 2018

(54) FIELD DEVICE HAVING CHASSIS GROUND CONNECTION IN A POTTED CONFIGURATION

(71) Applicant: Honeywell International Inc., Morris Plains, NJ (US)

(72) Inventors: Balaji Prasad Muttam, Telangana (IN); Jaison Cherian, Karnataka (IN); Ajit Deshpande, Telangana (IN)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 15/418,836

(22) Filed: Jan. 30, 2017

(51) Int. Cl.
| | |
|---|---|
| *H05K 1/14* | (2006.01) |
| *H05K 5/00* | (2006.01) |
| *H01R 4/02* | (2006.01) |
| *H01R 12/71* | (2011.01) |
| *H01R 43/20* | (2006.01) |
| *H05K 1/11* | (2006.01) |
| *H05K 7/14* | (2006.01) |
| *H05K 3/40* | (2006.01) |

(52) U.S. Cl.
CPC ............ *H05K 5/0026* (2013.01); *H01R 4/02* (2013.01); *H01R 12/71* (2013.01); *H01R 43/205* (2013.01); *H05K 1/115* (2013.01); *H05K 1/144* (2013.01); *H05K 3/40* (2013.01); *H05K 7/1427* (2013.01); *H05K 2201/042* (2013.01)

(58) Field of Classification Search
CPC ...... H05K 5/0026; H05K 1/115; H05K 1/144; H05K 7/1427; H05K 3/40; H05K 2201/042; H01R 4/02; H01R 12/71; H01R 43/205

USPC ........................................................ 361/803
See application file for complete search history.

(56) References Cited

U.S. PATENT DOCUMENTS

| | | | |
|---|---|---|---|
| 5,803,604 A | 9/1998 | Pompei | |
| 6,493,233 B1* | 12/2002 | De Lorenzo | ........... H05K 3/325 174/138 G |
| 7,208,735 B2 | 4/2007 | Sierra et al. | |
| 8,787,848 B2 | 7/2014 | Kielb et al. | |
| 8,822,844 B1 | 9/2014 | Dimke et al. | |

(Continued)

OTHER PUBLICATIONS

Dillon, J., Design Practices for Low-Power External Oscillators, Microchip Technology Inc. Mar. 26, 2009, AN1288, 6 pages.

(Continued)

*Primary Examiner* — Sherman Ng
(74) *Attorney, Agent, or Firm* — Kermit D. Lopez; Luis M. Ortiz; OL Patents

(57) ABSTRACT

A field device apparatus includes a field device that includes a first PCB (Printed Circuit Board) based on a PCB outline of a PWA (Printed Wiring Assembly) and a second PCB based on the PCB outline. One or more pass-through-hole standoffs can be configured with respect to the first and second PCB's in a configuration, wherein the PCB outline is extended to mount the pass-through-hole standoff to the first PCB and the second PCB. The pass-through-hole standoff can be soldered to the first PCB which is connected to a chassis ground that allows a mounting screw to make contact from a top side of the field device to a field mount housing through the pass-through-hole standoff, thereby effectively providing chassis ground connection through mounting screws to the external world. The pass-through-hole standoff can include a through-hole, but does not contain a thread therein.

20 Claims, 4 Drawing Sheets

(56) References Cited

U.S. PATENT DOCUMENTS

| | | |
|---|---|---|
| 8,984,641 B2 | 3/2015 | Tandon et al. |
| 9,089,043 B2 | 7/2015 | Gillard et al. |
| 2010/0033885 A1 | 2/2010 | Hotchkiss et al. |
| 2010/0219941 A1 | 9/2010 | Pagano et al. |
| 2012/0063065 A1 | 3/2012 | Perrault et al. |
| 2013/0148322 A1* | 6/2013 | Fosnes .................. H05K 1/141 361/803 |
| 2015/0366084 A1 | 12/2015 | Arul et al. |
| 2016/0005523 A1 | 1/2016 | Jacobs |

OTHER PUBLICATIONS

DIN rail—Wikipedia, printed Dec. 2, 2016, 3 pages.
Electronic packaging—Wikipedia, the free encyclopedia, printed Oct. 5, 2016, 4 pages.
Potting (electronics)—Wikipedia, the free encyclopedia, printed Oct. 5, 2016, 1 page.
PottingSolutions, Potting Solutions Potting Hints, http://www.pottingsolutions.com/my site/Technology/potting_hints.htm#potting PC boards, printed Oct. 5, 2016, 4 pages.

* cited by examiner

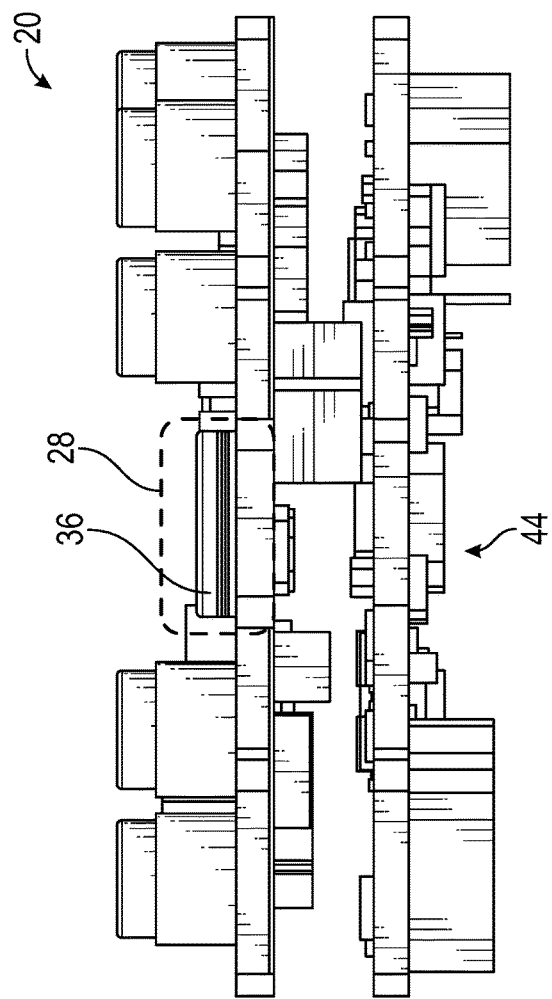
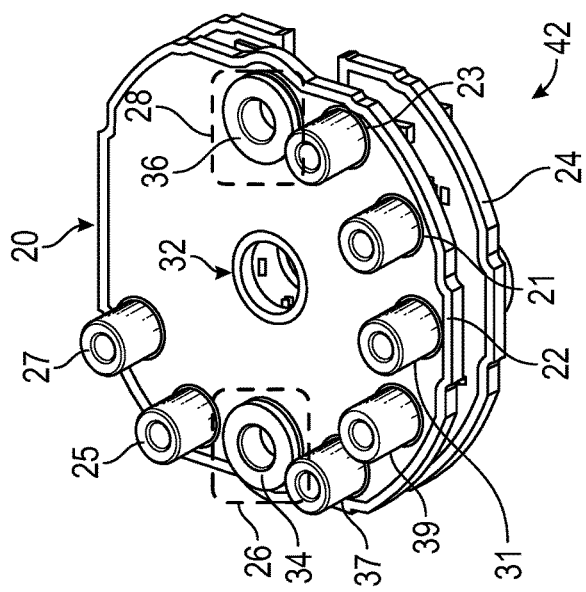
FIG. 4B
FIG. 4A

FIELD DEVICE HAVING CHASSIS GROUND CONNECTION IN A POTTED CONFIGURATION

TECHNICAL FIELD

Embodiments are related to electronic field devices utilized in industrial and, hazardous environments. Embodiments are also related to field devices that include a PCB (Printed Circuit Board) and a chassis grounding arrangement.

BACKGROUND

Field devices, which can include industrial process transmitters, controllers, etc., are used in industrial process facilities in a variety of settings. For example, field devices can include a sensor to sense pressure, temperature, vibration, flow, or nearly any other parameter associated with an industrial process, and/or can include an actuator or other device that manages, controls, or otherwise interacts with an industrial process. Many industrial process facilities are located in corrosive environments or may be subject to a risk of fire, explosion, or vibration, and therefore field devices must generally be constructed to be explosion-proof and otherwise able to suitably withstand operating environment conditions. The field device can communicate—wirelessly or using a hard-wired connection (e.g., a standard 4-20 mA loop) with a control room, other device, etc., to help provide industrial process management.

BRIEF SUMMARY

The following summary is provided to facilitate an understanding of some of the innovative features unique to the disclosed embodiments and is not intended to be a full description. A full appreciation of the various aspects of the embodiments disclosed herein can be, gained by taking the entire specification, claims, drawings, and abstract as a whole.

It is, therefore, one aspect of the disclosed embodiments to, provide for an improved field device for use in industrial and hazardous environments.

It is another aspect of the disclosed embodiments to provide for a field device having a chassis/ground connection from a PCB (Printed Circuit Board) to a field mount housing by extending the board outline and using a pass-through hole standoff in a potted electronic configuration.

It is also an aspect of the disclosed embodiments wherein the term pass-through hole standoff includes THT (Through Hole Technology) or SMT (Surface Mount Technology).

It is also an aspect of the disclosed embodiments to provide a field device shaped like a "hockey puck" or another shape (e.g., circular, square, rectangular, etc.), and which is capable of being implemented in the context of applications such as, for example, a DIN Rail mounting or thermowell type housing or other suitable explosion proof/weather proof housings.

The aforementioned aspects and other objectives and advantages can now be achieved as described herein. In an example embodiment, a field device apparatus includes a field device that can include a first PCB (Printed Circuit Board) based on a PCB outline of a PWA (Printed Wiring Assembly) and a second PCB based on the PCB outline. One or more pass-through-hole standoffs can be configured with respect to the first and second PCB's in a configuration, wherein the PCB outline is extended to mount the pass-through-hole standoff to the first PCB and the second PCB. The pass-through-hole standoff can be soldered to the first PCB to allow a mounting screw to make contact from a top side of the field device to a field mount housing (e.g., a DIN Rail) through the pass-through-hole standoff. The pass-through-hole standoff includes a through-hole, but does not contain a thread therein.

In another example embodiment, the field device can include a field mount housing in the shape of a hockey puck, wherein the housing maintains the first PCB, the second PCB, and the at least one pass-through-hole standoff. Note that the shape of the field mount housing as a hockey puck is merely one possible shape that can be employed in an embodiment. Other example embodiments may possess other shapes (e.g., circular, square, diamond, rectangular, etc.).

In another example embodiment, the field device includes a chassis grounding between the first PCB and the second PCB to the field mount housing in a potted configuration. In some example embodiments, the pass-through-hole standoff can be soldered prior to potting in the potted configuration.

The disclosed embodiments thus describe an apparatus and method for achieving a chassis/ground connection from the PCB (or multiple PCBs) to a field mount housing by extending board outline and using pass through standoff in a potted Hokey Puck model electronic design. Example embodiments can utilize a PCB mounting hole area for chassis ground connection concept to connect external earth equipment in a potted "hockey puck" (or other shape) configuration. The standoff can be assembled during PWA assembly. There is no need for an additional PCB assembly or mechanical fixing processes prior to potting the device.

The ability to have the chassis connected properly to external earth through mounting options in potted puck enclosure is one advantage of the disclosed embodiments. Another advantage is that the configuration of the disclosed embodiments helps to minimize external EMI/EMC interference with the field device alone, thereby eliminating need for an external housing. Additionally, with this approach the potting material will not fall or overlap at the screw contact area because a specific heighted standoff is used. Hence, this arrangement will not suffer from issues such as making proper contact between the PCB and the screw to the connected external chassis.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIGS. 4A and 4B illustrate a top perspective view and a side cut-a way view of top and bottom PCBs with a pass-through-hole standoff, in accordance with an example embodiment.

DETAILED DESCRIPTION

Figure 1:
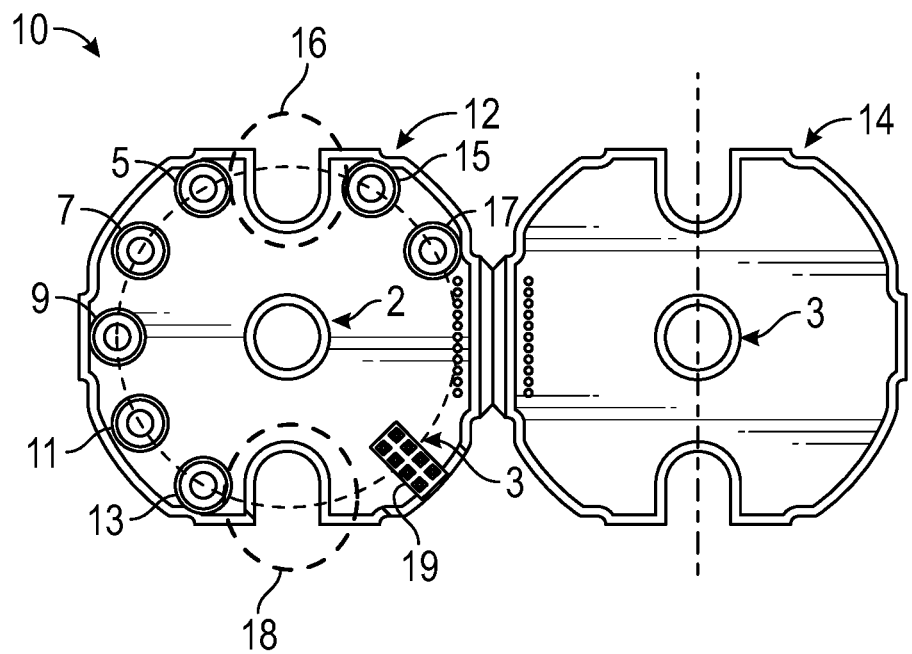
FIG. 1 illustrates respective views of a first PCB and a second PCB of an initial PCB outline of a field device, in accordance with an example embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout. As used herein, the term "and/or" includes any and all combinations of one or more of the associated listed items.

Subject matter may be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. The following detailed description is not, therefore, intended to be interpreted in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context. The term "at least one" can also refer "one or more".

Note that the term pass-through hole standoff or pass-through hole standoff technology as utilized herein can include both THT (Through Hole Technology) or SMT (Surface Mount Technology).

The term "field device" as utilized herein generally refers to a device and/or related system in an industrial process control environment, such as sensors for sensing physical measurements for the process being run (e.g., pressure, temperature, level, or fluid flow) and instruments for performing control output actions (e.g., control valves, actuators, or drive units) for the processing units in industrial plants may be located across a large geographic area. These instruments are generally referred to as "field devices" or "field instruments" (hereafter "field devices"), which may be located in areas that are either manned or unmanned.

In some example embodiments, the field device can be configured as a so-called "smart" field device that provides valuable asset data besides the basic sensor or control function for a physical parameter. This asset data relates to the diagnostic health of the field device and the process/application with which it is involved. In the case of a smart position sensor, for example, an ability to self-calibrate is provided by a combination of an Application-Specific Integrated Circuit (ASIC) and an array of magneto-resistive (MR) sensors to accurately and reliably determine the position of a magnet attached to a moving object (e.g., elevator, valve, machinery, etc.), so that the object's position can be accurately determined.

In some example embodiments, a field device can use standard field communication protocols such as HART, WirelessHART, FOUNDATION FIELDBUS, PROFIBUS, PROFINET, or ISA 100.11a to communicate with a remote host system or device, such as a network server, distributed control system (DCS), safety system, instrument asset management system, or handheld configurator. Such host systems or devices generally include write access to the smart devices, and often the smart device itself supports configuration through its own local interfaces, such as a local display screen and switches. The configuration parameters are set for each field device by the user with any of the aforementioned hosts available so that the field device operates as intended.

Since field devices may perform mission critical measurement and control, the data security in such devices is important. Accordingly, any changes to the configuration data of the device (values held in different process parameters) need to be safely guarded, and care is generally taken to prevent unintended configuration changes to be made after commissioning. Configuration changes, whether changed inadvertently or changed maliciously, may be detrimental to the operation of the plant, and in certain cases might put human life at risk.

A field device apparatus is therefore disclosed, which includes a field device that includes a first PCB (Printed Circuit Board) based on a PCB outline of a PWA (Printed Wiring Assembly) and a second PCB based on the PCB outline. One or more pass-through-hole standoffs can be configured with respect to the first and second PCB's in a configuration, wherein the PCB outline is extended to mount the pass-through-hole standoff to the first PCB and the second PCB. The pass-through-hole standoff can be soldered to the first PCB which is connected to a chassis ground that allows a mounting screw to make contact from a top side of the field device to a field mount housing through the pass-through-hole standoff, thereby effectively providing chassis ground connection through mounting screws to the external world. The pass-through-hole standoff can include a through-hole, but does not contain a thread therein.

FIG. 1 illustrates respective views of a first PCB 12 and a second PCB 14 of an initial PCB outline of a field device 10, in accordance with an example embodiment. As shown in FIG. 1, the field device includes two PCBs 12 and 14, which will be separated with the PCB 12 constitution a first or top PCB and PCB 14 constituting a second or lower PCB. The configuration shown in FIG. 1 is thus an outline of a PWB (Printed Wiring Board) assembly. A group of circular dowel or spacer like components 5, 7, 9, 11, 13, 15, 17 can be located on the PCB 12. Each dowel or spacer like component 5, 7, 9, 11, 13, 15, 17 has a cylindrical shape with a circular hole or a gap, which has screw threads at the end of each component. The dowel or spacer like component 5, 7, 9, 11, 13, 15, 17 is generally located near the perimeter of the PCB 12.

The PCB 12 includes a hole 2 that is centrally located within PCB 12. PCB 14 is also similarly configured with a hole 3. In the arrangement shown in FIG. 1, each PCB 12 and 14 is configured with a semicircular area, which is shown with respect to the PCB 12 in FIG. 1 as the semicircular areas 16, 18 (surrounded by a circle). The PCB 12 also maintains an electronic component 19.

The overall shape of the PCB 12 and PCB 14 is that of a "Hockey Puck" and hence the term "Hockey Puck" can refer to such a field device (e.g., a hockey puck field device, etc.). Although the field device 10 has a generally hockey puck like shape, it can be appreciated that the field device can be configured with other shapes, such as, for example, circular, square, rectangular, diamond shapes, and so on. Embodiments are not limited to only a hockey puck like shape. The hockey puck shape shown in FIG. 1 is, however, generally circular as indicated by the dashed circular lines shown with respect to the PCB 12.

The field device can be shaped like a "hockey puck" or another shape (e.g., circular, square, rectangular, etc.), which is capable of being implemented in the context of applications such as, for example, a DIN Rail mounting or thermowell type housing. Note that the term "DIN rail" utilized herein refers to a metal rail of a standard type that is widely used for mounting circuit breakers and industrial control equipment inside equipment racks. These products are typically made from cold rolled carbon steel sheet with a zinc-plated or bright surface finish. The term derives from the original specifications published by Deutsches Institut für Normung (DIN) in Germany, which have since been adopted as European (EN) and international (IEC) standards.

Figure 2:
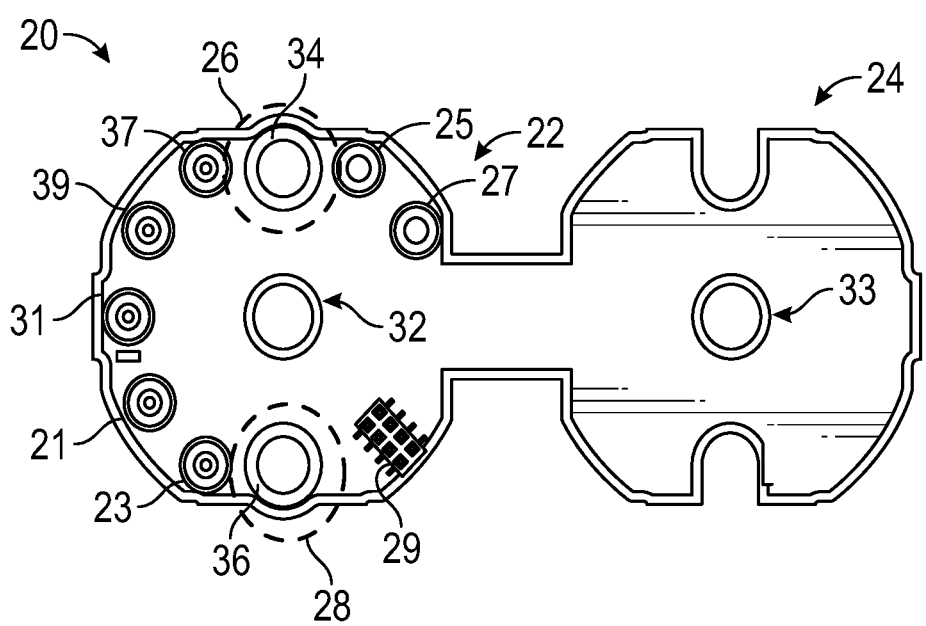
FIG. 2 illustrates respective top and bottom views of an updated PCB outline of a modified field device, in accordance with an example embodiment.

FIG. 2 illustrates respective top and bottom views of a first PCB 22 and a second PCB 24 of an updated PCB outline of a modified field device 20, in accordance with an example embodiment. Like the PCB 12 shown in FIG. 1, the PCB 22 depicted in FIG. 2 includes a group of circular dowel or spacer like components 21, 23, 25, 27, 31, 37, 39 located on the PCB 12. Each of the dowel or spacer like components 21, 23, 25, 27, 31, 37, 39 includes a circular gap that has screw threads therein. The PCB 22 can maintain an electronic component 29. The PCB 22 further includes a hole or circular gap 32 located centrally in the PCB 22. The PCB 24 is configured with a similar centrally located hole 33. The PCB 22 includes two areas 26 and 28 that respectively maintain a pass-through-hole standoff 34 and 36. Thus, the PCB outline shown in FIG. 2 is an extended PCB outline to provide the necessary area required to mount the pass-through-hole standoffs 34 and 36. This feature is shown in greater detail in FIG. 3.

Figure 3:
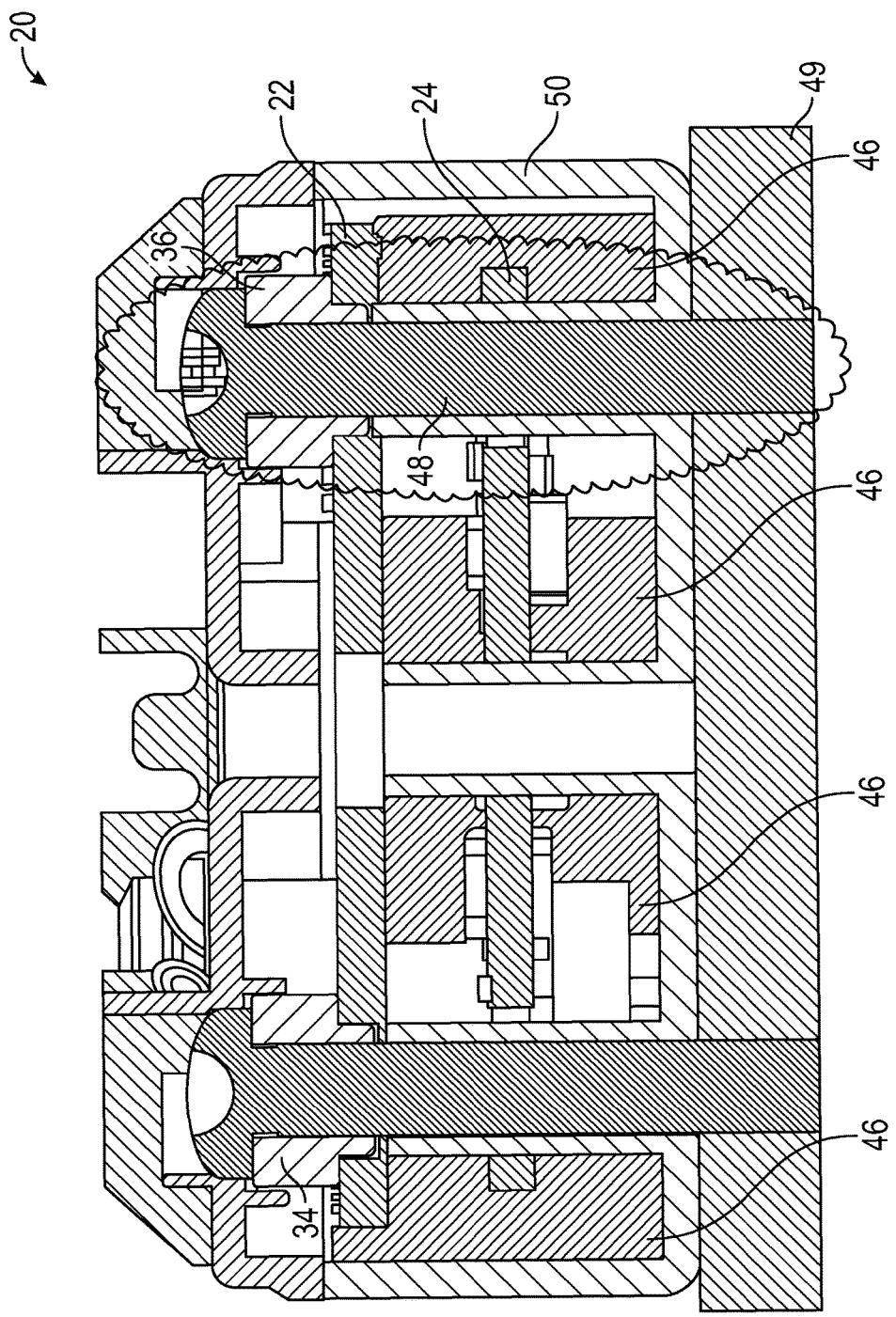
FIG. 3 illustrates a side cut-away view of a field device including potting material and a field mount housing, in accordance with an example embodiment.

FIG. 3 illustrates a side cut-away view of the field device 20 shown in FIG. 2 including the addition of a potting material 46 and a field mount housing 49, in accordance with an example embodiment. Note that in FIGS. 2-3, identical or similar parts or elements are generally indicated by identical reference numerals. The field device 20 as shown in FIG. 3 includes the pass-through-hole standoff 34 and pass-through-hole standoff 36. The field device 20 also includes the first PCB 22 and the second PCB board 24. A mounting screw 48 is shown inserted within the pass-through-hole standoff 36 and passes through both the first PCB 22 and second PCB 24. A "hockey puck" housing 50 generally surrounds the first and second respective PCBs 22 and 24 which in turn is maintained with the field mount housing 49 or DIN Rail or any other suitable mounting area.

Each of the pass-through-hole standoffs 34 and 36 can be soldered on the PCB 22 and/or 24, which allows the mounting screw 48, for example, to make contact from the top side of field device (i.e., through the top of the PCB 22 or PCB 24 if the pass-through-hold standoffs 34 and 36 are located in PCB 24) to the field mount housing 49 through the pass-through-hole standoff 34 and/or 36. Note that each of the pass-through-hole standoffs 34 and 36 have a hole, but does not have threads therein.

The field device 20 thus can include a first PCB 22 based on a PCB outline of a PWA and a second PCB 24 based on the PCB outline. One or more pass-through-hole standoffs 34, 36 can be configured with respect to the first and second PCB's 22, 24 in a configuration wherein the PCB outline is extended to mount the pass-through-hole standoffs 34 and 36 to the first and second PCB's 22, 24. Each pass-through-hole standoff can be soldered to the first and/or second PCB to allow the mounting screw 48 to make contact from the top side of the field device 20 to the field mount housing 49 through the pass-through-hold standoffs. The pass-through-hole standoff includes a through-hole, but does not contain a thread therein.

The field device can in some embodiments include a field mount housing in the shape of a hockey puck, which maintains the first PCB, the second PCB, and the pass-through-hole standoffs. Note that the shape of the field mount housing as a hockey puck is merely one possible shape that can be employed in an embodiment Other embodiments may have other shapes (e.g., circular, square, diamond, rectangular, etc.). The field device 20 thus can include a chassis grounding between the first PCB 22 and the second PCB 24 to the field mount housing 49 in a potted configuration facilitated by the potted material 46. In some example embodiments, the pass-through-hole standoff 34 and/or 36, for example, can be soldered prior to potting.

Note that "potting" (also referred to as "encapsulation") can include steps or operations for immersing the part or assembly in a liquid resin, and then curing it. Potting can be accomplished in a pre-molded potting shell or directly in a mold. Potting with respect to field device 20 can be implemented to protect semiconductor components from moisture and mechanical damage, and to serve as a mechanical structure holding the lead frame and the chip together. Potting can be rigid or soft. When void-free potting is required, the product can be placed in a vacuum chamber while the resin is still liquid, followed by holding a vacuum for several minutes to draw the air out of internal cavities and the resin itself, and then the vacuum is released. Atmospheric pressure collapses the voids and forces the liquid resin into all internal spaces. Vacuum potting works best with resins that cure by polymerization rather than solvent evaporation.

The term "potting" as utilized herein and in the field of electronic is a process of filling a complete electronic assembly with a solid or gelatinous compound for resistance to shock and vibration, and for exclusion of moisture and corrosive agents. Thermo-setting plastics or silicone rubber gels can be used. In some example embodiments, silicone or epoxy can be utilized to protect from impact and loose wires.

FIGS. 4A and 4B respectively illustrate a top perspective view 42 and a side cut-away view 44 of the field device 20 with its top and bottom PCBs 22, 24 with pass-through-hold standoffs 34 and 36, in accordance with an example embodiment. Note that in FIGS. 2, 3, and 4A-4B, identical or similar parts are generally indicated by identical reference numerals.

The field device 20 (e.g., also referred to as a "hockey puck device" or "hockey puck model") is configured with a pass-through-standoff arrangement in a potted hockey puck model electronic design. A PCB mounting hole area can be utilized for a chassis ground connection to connect external earth equipment in such a hockey puck model. The standoff can be assembled during PWA assembly without the need for an additional PCB assembly or mechanical fixing processes prior to potting the device.

Figure 5:
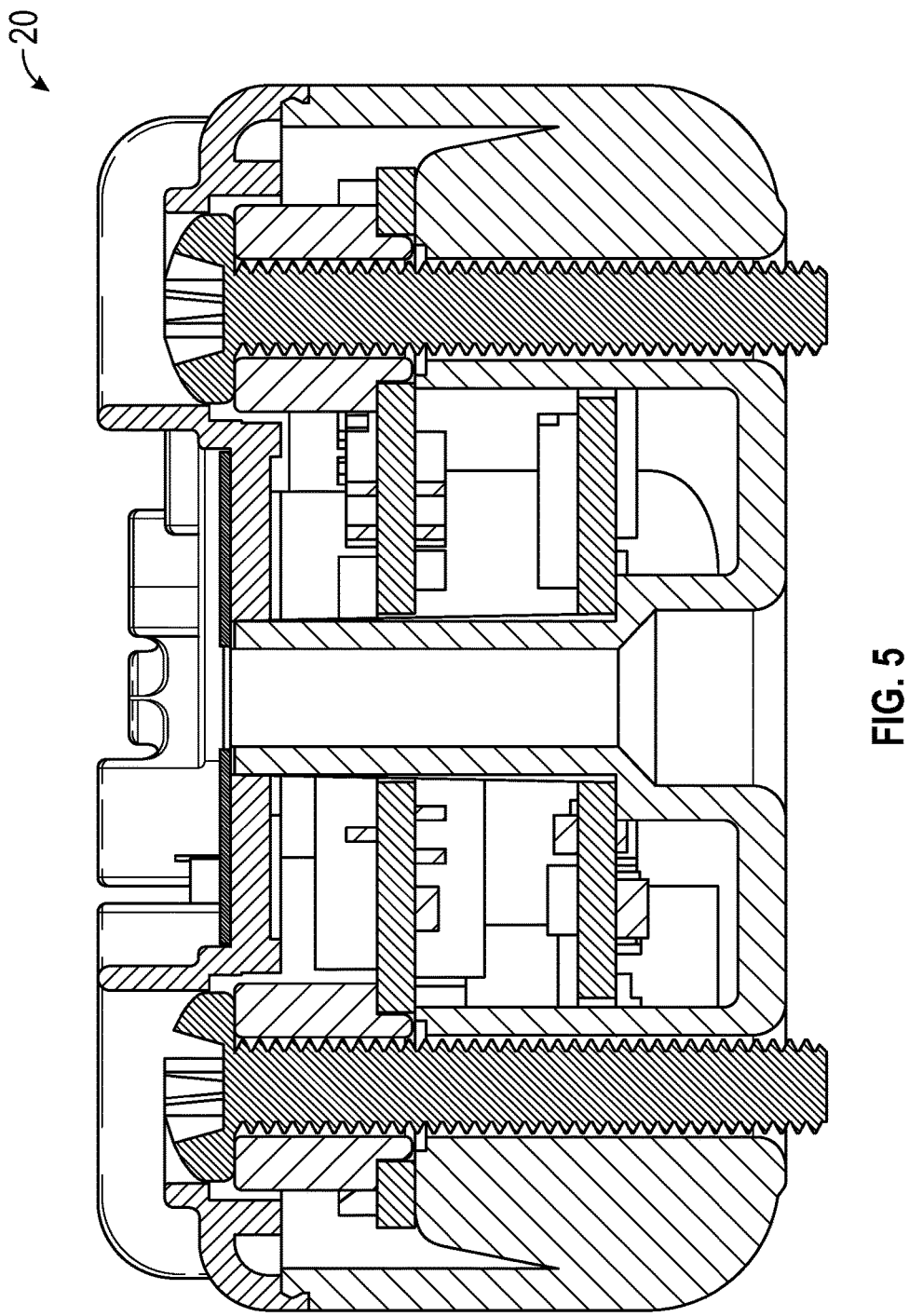
FIG. 5 illustrates a side view of a device having a pass-through-hole standoff configuration, in accordance with another example embodiment.

FIG. 5 illustrates a side view of the field device 20 having a pass-through-hole standoff configuration, in accordance with another example embodiment. The illustration shown in FIG. 5 illustrates two screw locations that can be implemented per each field device 20.

A number of advantages can be obtained as a result of implementing the disclosed embodiments, such as, for example, the ability to have the chassis connected property to external earth through mounting options in the potted puck enclosure. This arrangement helps to minimize external EMI/EMC interference with the puck alone, thereby eliminating the need for an external housing. The potting material will not fall or overlap at the screw (e.g., mounting screw 48) contact area since a specific heighted standoff (e.g., standoffs 34 and/or 36) is used. In some cases if the potting material has a high viscosity, then a gasket or a seal can be used to prevent the potting material from leaking into the screw mounting hole of the field device housing. Thus, such embodiments will not suffer issues involving making proper contact between the PCB (e.g., PCB 22 and/or 24) screw (e.g., mounting screw 48) to the connected external chassis.

The disclosed embodiments do not require an additional wiring or soldering process with the disclosed "puck" device. Additionally, such embodiments can reduce costs by utilizing an automated assembly process and providing for a simple mechanical puck design. Such embodiments can also improve routing clearance flexibility from the chassis and clearances from the board edge to parts with the disclosed extended PCB outline.

Based on the foregoing it can be appreciated that a number of exam pie embodiments, preferred and alternative, are disclosed herein. For example, in one embodiment, a field device apparatus can include a field device comprising a first PCB (Printed Circuit Board) based on a PCB outline of a PWA (Printed Wiring Assembly) and a second PCB based on the PCB outline; and at least one pass-through-hole standoff, wherein the PCB outline is extended to mount the at least one pass-through-hole standoff to the first PCB and the second PCB, the at least one pass-through-hole standoff soldered to the first PCB to allow a mounting screw to make contact from a top side of the field device to a field mount housing through the at least one pass-through-hold standoff, wherein the pass-through-hole standoff comprises a through-hole but does not contain a thread therein.

In some example embodiments, the field device can include a field mount housing in the shape of a hockey puck, wherein the housing maintains the first PCB, the second PCB, and the at least one pass-through-hole standoff. In yet another example embodiment, the field device can include a field mount housing, the field device comprising a chassis grounding between the first PCB and the second PCB to the field mount housing in a potted configuration. In some example embodiments, the at least one pass-through-hole standoff can be soldered prior to potting in the potted configuration. In some example embodiments, the aforementioned first PCB includes a top PCB and the second PCB comprises a lower PCB. In other example embodiments, first housing can surround the first and second PCBs and a second housing can surround and maintain the field housing.

In some example embodiments, the first PCB can be configured with a hole centrally located in the first PCB and the second PCB can be configured with a hole centrally located in the second PCB. In still other example embodiments, a plurality of spacers can be located on the first PCB in a generally circular pattern proximate to the perimeter of the first PCB. In yet other example embodiments, the at least one pass-through-hole standoff can include a first pass-through-hole standoff and a second pass-through-hole standoff with respect to the first and second PCBs.

In another example embodiment, a field device apparatus can include a field device comprising a first PCB (Printed Circuit Board) based on a PCB outline of a PWA (Printed Wiring Assembly) and a second PCB based on the PCB outline; a field mount housing, wherein the field device comprises the field mount housing, the field device further including a chassis grounding between the first PCB and the second PCB to the field mount housing; and at least one pass-through-hole standoff, wherein the PCB outline is extended to mount the at least one pass-through-hole standoff to the first PCB and the second PCB, the at least one pass-through-hole standoff soldered to the first PCB to allow a mounting screw to make contact from a top side of the field device to a field mount housing through the at least one pass-through-hold standoff, wherein the pass-through-hole standoff comprises a through-hole, but does not contain a thread therein.

In yet another example embodiment, a method of configuring a field device apparatus can be implemented. Such a method can include steps or operations such as, for example, configuring a field device to include a first PCB (Printed Circuit Board) based on a PCB outline of a PWA (Printed Wiring Assembly) and a second PCB based on the PCB outline; and providing at least one pass-through-hole standoff, wherein the PCB outline is extended to mount the at least one pass-through-hole standoff to the first PCB and the second PCB, the at least one pass-through-hole standoff soldered to the first PCB to allow a mounting screw to make contact from a top side of the field device to a field mount housing through the at least one pass-through-hold standoff, wherein the pass-through-hole standoff comprises a through-hole, but does not contain a thread therein. In another example embodiment, the aforementioned method can include a step or operation for configuring the field device to include a field mount housing in a shape of a hockey puck, wherein the housing maintains the first PCB, the second PCB, and the at least one pass-through-hole standoff.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

The invention claimed is:

1. A field device apparatus, comprising:
   a field device comprising a first PCB (Printed Circuit Board) based on a PCB outline of a PWA (Printed Wiring Assembly) and a second PCB based on said PCB outline; and
   at least one pass-through-hole standoff, wherein said PCB outline is extended to mount said at least one pass-through-hole standoff to said first PCB and said second PCB, said at least one pass-through-hole standoff soldered to said first PCB to allow a mounting screw to make contact from a top side of said field device to a field mount housing through said at least one pass-through-hold standoff, wherein said pass-through-hole standoff comprises a through-hole, but does not contain a thread therein.

2. The apparatus of claim 1 wherein said field device comprises a field mount housing in a shape of a hockey puck, wherein said housing maintains said first PCB, said second PCB, and said at least one pass-through-hole standoff.

3. The apparatus of claim 1 wherein said field device comprising a field mount housing, said field device, comprising a chassis grounding between said first PCB and said second PCB to said field mount housing in a potted configuration.

4. The apparatus of claim 3 wherein said at least one pass-through-hole standoff is soldered prior to potting in said potted configuration.

5. The apparatus of claim 1 wherein said first PCB comprises a top PCB and said second PCB comprises a lower PCB.

6. The apparatus of claim 1 further comprising a first housing surrounding said first and second PCBs and a second housing that surrounds and maintains said field housing.

7. The apparatus of claim 1 wherein said first PCB is configured with a hole centrally located in said first PCB and said second PCB is configured with a hole centrally located in said second PCB.

8. The apparatus of claim 1 further comprising a plurality of spacers located on said first PCB in a generally circular pattern proximate to the perimeter of said first PCB.

9. The apparatus of claim 1 wherein said at least one pass-through-hole standoff comprises a first pass-through-hole standoff and a second pass-through-hole standoff with respect to said first and second PCBs.

10. A field device apparatus, comprising:
    a field device comprising a first PCB (Printed Circuit Board) based on a PCB outline of a PWA (Printed Wiring Assembly) and a second PCB based on said PCB outline;
    a field mount housing, wherein said field device comprises said field mount housing, said field device further including a chassis grounding between said first PCB and said second PCB to said field mount housing; and
    at least one pass-through-hole standoff, wherein said PCB outline is extended to mount said at least one pass-through-hole standoff to said first PCB and said second PCB, said at least one pass-through-hole standoff soldered to said first PCB to allow a mounting screw to make contact from a top side of said field device to a field mount housing through said at least one pass-through-hold standoff, wherein said pass-through-hole standoff comprises a through-hole, but does not contain a thread therein.

11. The apparatus of claim 10 wherein said field device comprises said field mount housing in a shape of a hockey puck, wherein said housing maintains said first PCB, said second PCB and said at least one pass-through-hole standoff.

12. The apparatus of claim 10 wherein said field device includes said chassis grounding between said first PCB and said second PCB to said field mount housing in a potted configuration.

13. The apparatus of claim 12 wherein said at least one pass-through-hole standoff is soldered prior to potting in said potted configuration.

14. The apparatus of claim 10 wherein said first PCB comprises a top PCB and said second PCB comprises a lower PCB.

15. The apparatus of claim 10 further comprising a first housing surrounding said first and second PCBs and a second housing that surrounds and maintains said field housing.

16. The apparatus of claim 10 wherein said first PCB is configured with a hole centrally located in said first PCB and said second PCB is configured with a hole centrally located in said second PCB.

17. The apparatus of claim 10 further comprising a plurality of spacers located on said first PCB in a generally circular pattern proximate to the perimeter of said first PCB.

18. The apparatus of claim 10 wherein said at least one pass-through-hole standoff comprises a first pass-through-hole standoff and a second pass-through-hole standoff with respect to said first and second PCBs.

19. A method of configuring a field device apparatus, said method comprising:
    configuring a field device to include a first PCB (Printed Circuit Board) based on a PCB outline of a PWA (Printed Wiring Assembly) and a second PCB based on said PCB outline; and
    providing at least one pass-through-hole standoff, herein said PCB outline is extended, to mount said at least one pass-through-hole standoff to said first PCB and said second PCB, said at least one pass-through-hole standoff soldered to said first PCB to allow a mounting screw to make contact from a top side of said field device to a field mount housing through said at least one pass-through-hold standoff, wherein said pass-through-hole standoff comprises a through-hole, but does not contain a thread therein.

20. The method of claim 19 further comprising configuring said field device to comprise a field mount housing in a shape of a hockey puck, wherein said housing maintains said first PCB, said second PCB, and said at least one pass-through-hole standoff.

* * * * *